United States Patent
Chao

(10) Patent No.: US 7,791,099 B1
(45) Date of Patent: Sep. 7, 2010

(54) LIGHTING DEVICE USING HIGH POWER LED WITH MULTIPLE LEAD

(75) Inventor: Hsin-Chien Chao, Jhongli (TW)

(73) Assignee: Hsin-Sun Engineering Co., Ltd., Taoyuan County (TW)

( * ) Notice: Subject to any disclaimer, the term of this patent is extended or adjusted under 35 U.S.C. 154(b) by 0 days.

(21) Appl. No.: 12/410,480

(22) Filed: Mar. 25, 2009

(51) Int. Cl.
*H01L 33/00* (2010.01)

(52) U.S. Cl. .................. 257/99; 257/100; 257/678; 257/787

(58) Field of Classification Search .................. 257/99, 257/100, 678, 787
See application file for complete search history.

(56) References Cited

U.S. PATENT DOCUMENTS

| | | | |
|---|---|---|---|
| 2008/0170391 A1* | 7/2008 | Norfidathul et al. | 362/227 |
| 2008/0258162 A1* | 10/2008 | Koung et al. | 257/98 |
| 2009/0283779 A1* | 11/2009 | Negley et al. | 257/88 |
| 2010/0127283 A1* | 5/2010 | van de Ven et al. | 257/89 |

* cited by examiner

*Primary Examiner*—Long Pham
(74) *Attorney, Agent, or Firm*—Leong C. Lei

(57) ABSTRACT

The lighting device mainly contains a first material, a second material, at a light generation chip, and multiple metallic leads. The metallic leads are sandwiched between the first and second materials, and arranged in a radial manner around the indentation or the raised stand. The center of the first material has an obconical through channel and the center of the second material has either an indentation or a raised stand. The light generation chips are positioned in the center of the second material. High thermal conducting insulation paste is provided between the first material, the metallic leads, and the second material so that they are electrical insulated from each other. The present invention could achieve versatile color combinations and high brightness under superior heat dissipation effect, and could be applied in various types of packaging and welding.

9 Claims, 6 Drawing Sheets

LIGHTING DEVICE USING HIGH POWER LED WITH MULTIPLE LEAD

TECHNICAL FIELD OF THE INVENTION

The present invention generally relates to light emitting diodes (LEDs), and more particularly to a lighting device using high power LED as light source and having multiple metallic leads insulated by high terminal conducting insulation paste.

DESCRIPTION OF THE PRIOR ART

The light sources of traffic signal lamps, emergency indication lamps, or street lamps are gradually changed from conventional light bulbs and lamp tubes into LEDs. To achieve better brightness, usually high power LEDs are adopted. Currently, most popular applications of the LEDs are vehicles' direction lamps, brake lamps, and in-vehicle lamps, and flash lights. It is expected that LEDs will replace cold cathode fluorescent lamp (CCFL) to become LCD's backlight source.

For lighting devices using multiple LEDs, as there could be various color combinations or various degrees of brightness, they are quite suitable as indication lamps. As shown in FIG. 1, a lighting device 10 using multiple LEDs contains a first material 11, a second material 12, multiple light generation chips 13, and packaging material 14. The second material 12 is cut and separated into a number of electrode members 121 and the light generation chips 13 are positioned on one of the electrode members 121. Then, by a wire bonding process, the light generation chips 13 are electrically connected to the other electrode members 121, respectively. The first and second materials 11 and 12 are then stacked and adhered together, and an obconical through channel 111 is provided in the center of the first material 11. The light generation chips 13 are thereby exposed via the through channel 111. Finally, the through channel 111 is completely filled with the packaging material 14 to complete the packaging process. The light generation chips 13 are turned on when electricity is applied to the electrode members 121.

Since the though channel 111 is completely filled with the packaging material 14, a larger portion of the light from the light generation chips 13 will pass directly through the packaging material 14 while a smaller portion of the light is refracted/reflected by the wall of the through channel 111. The refraction by the packaging material 14 causes the light to distribute un-uniformly and therefore an un-even brightness within the lighting device 10's coverage area and an inferior indication and illumination effect. Furthermore, the lighting device 10 does not have enough leads to support more light generation chips 13 and, when a large number of LEDs are required, multiple lighting devices 10 have to be used and connected together. In addition, when the lighting device 10 is packaged or welded, its leads are overlapped with the heat dissipation area of the heat dissipation material 20, causing an inferior heat dissipation effect. Moreover, shared leads are only applicable to soldering pads 21 located on the surface of the heat dissipation material 20, but not applicable to various other types of packaging and welding operations.

SUMMARY OF THE INVENTION

Accordingly, an objective of the present invention is to provide a lighting device using high power LEDs capable of having superior heat dissipation effect for enhanced operational life span.

Another objective of the present invention is to provide a lighting device using high power LEDs with a reflective surface to achieve superior brightness and uniform coverage.

Yet another objective of the present invention is to provide a lighting device using high power LEDs with more exposed leads so as to be applicable to various packaging and welding.

To achieve the foregoing objectives, the lighting device of the present invention mainly contains a first material, a second material, at a light generation chip, and multiple metallic leads. The center of the first material has an obconical through channel and the center of the second material has either an indentation or a raised stand. The light generation chips, positioned in the indentation or on the raised stand, could be of a single light color or of various light colors, so as to achieve multiple color combinations or different degrees of brightness. The metallic leads, each having a wiring section, a zigzag section, and a welding section, are arranged in a radial manner around the indentation or the raised stand. The wiring sections are sandwiched between the first and second materials and the welding sections fan out radially. After wire-bonding, the light generation chips are connected to the wiring sections of the metallic leads, respectively. High thermal conducting insulation paste is provided between the first material, the metallic leads, and the second material so that they are electrical insulated from each other. The through channel is finally partially filled with the packaging material.

As such, the second material is in direct contact with a heat dissipation material (e.g., an aluminum base board) so that heat is immediately conducted through the heat dissipation material. The illumination effect and operational life span of the lighting device could both be enhanced due to the superior heat dissipation effect. Moreover, as the through channel is not completely filled with the packaging material and a reflective surface film is formed on the wall of the through channel, light from the light generation chips are refracted/reflected by the packaging material first, and then by the reflective surface film. The coverage area of the light device therefore is brighter and more uniform. In addition, due to the multiple, radially-arranged metallic leads, multiple light generation chips could be powered and therefore versatile color combinations and high brightness could be achieved. The design of exposed lead contacts avoid overlapping with the heat dissipation material and the decrease of heat dissipation area. The lighting device of the present invention could be applied in various types of packaging and welding.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
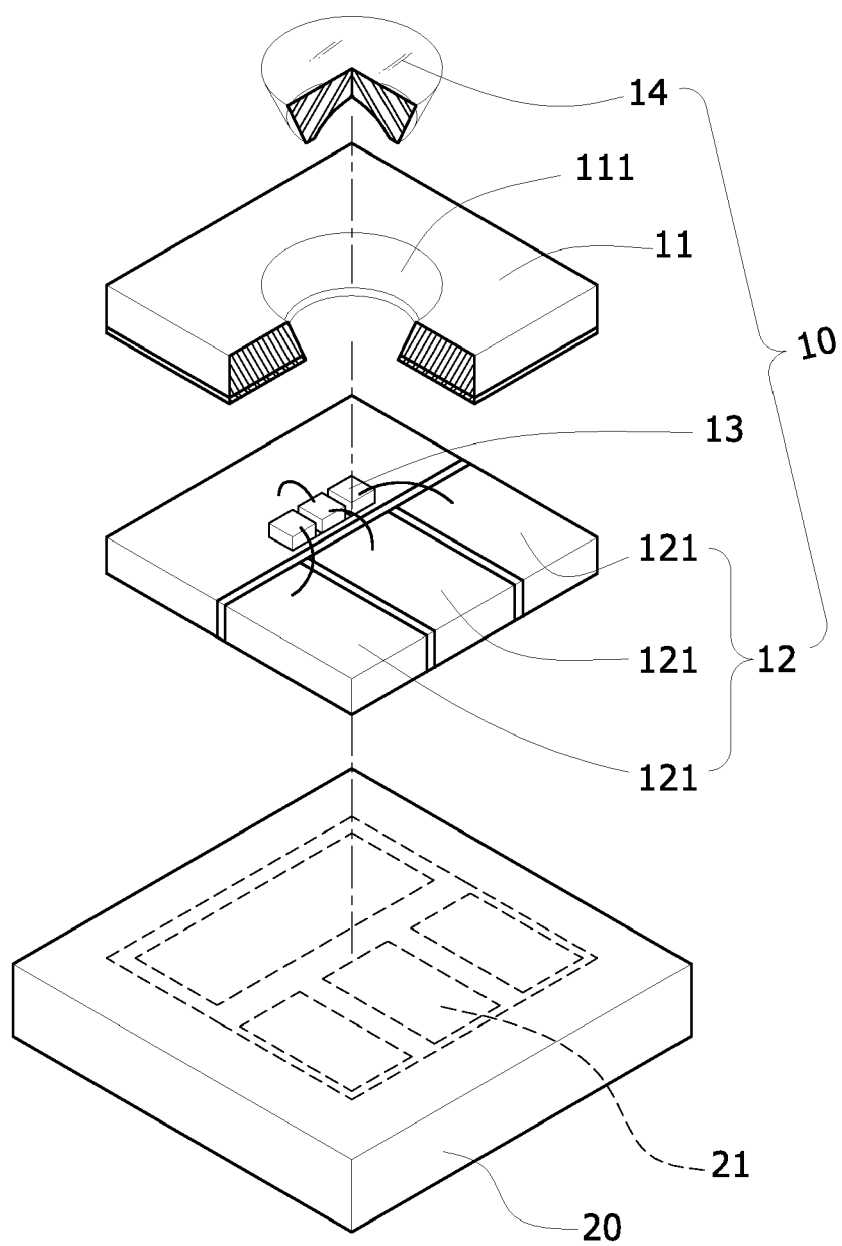
FIG. 1 is a perspective breakdown diagram showing the various components of a conventional lighting device using multiple LEDs.
Figure 2:
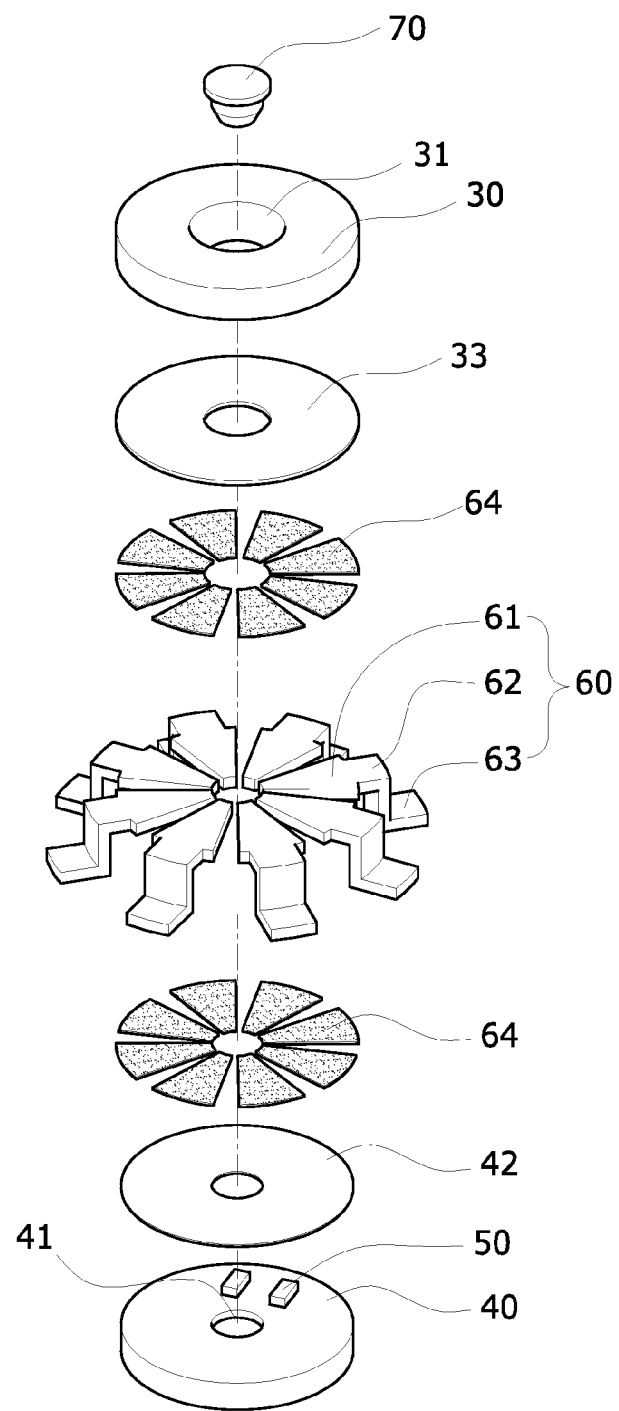
FIG. 2 is a perspective breakdown diagram showing the various components of a lighting device according to an embodiment of the present invention.
Figure 3:
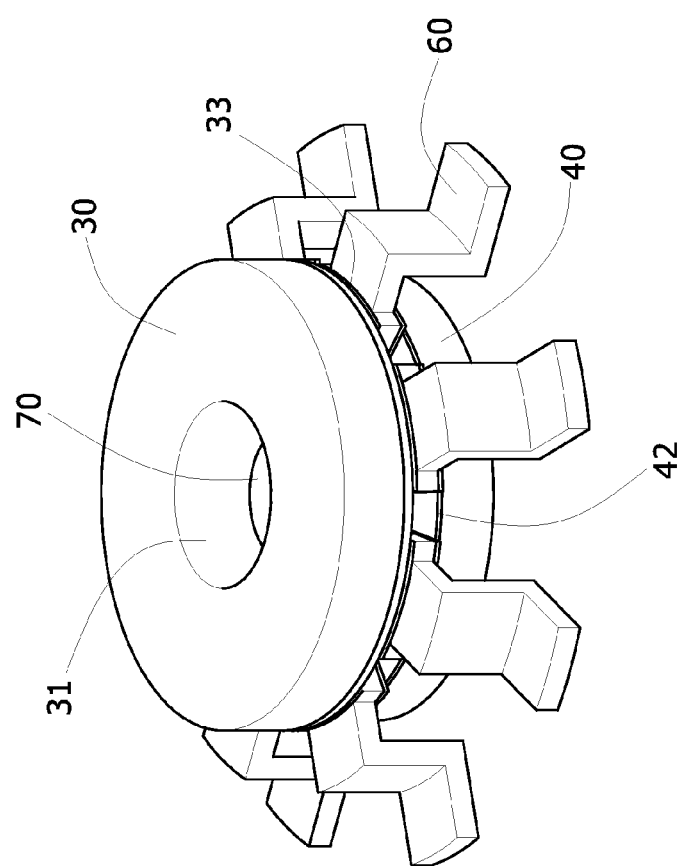
FIG. 3 is a perspective diagram showing the lighting device of FIG. 2 after its assembly.
Figure 4:
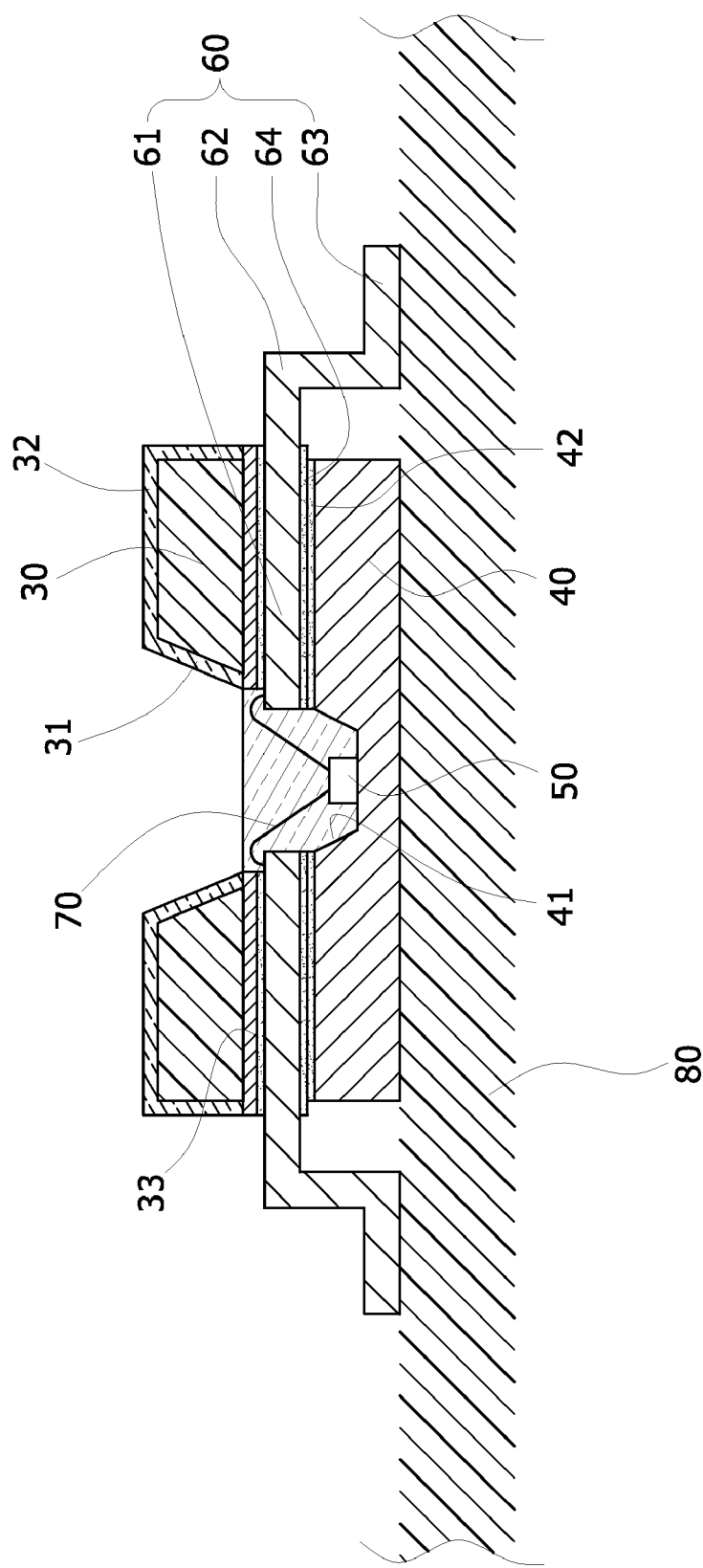
FIG. 4 is a sectional diagram showing the lighting device of FIG. 2.

As shown in FIGS. 2 to 4, a lighting device according to an embodiment of the present invention contains the following components.

A first material 30 is selected from a plastic material, a PCB material, or a metallic material, and, by injection molding or by computer numerical control (CNC) machining, an obconical through channel 31 is formed in the center of the first material 30. That is, the through channel 31 has a larger opening on a top side and a smaller opening on a bottom side of the first material 30.

Additionally, a bright surface film 32 is coated on the surface of the first material 30 by chemical vapor deposition or electroplating so that the through channel 31 becomes reflective. The bottom side of the first material 30 around the through channel 31 is further coated or deployed by a high thermal conducting insulation paste 33.

A second material 40 is selected from a metallic material, a graphite material, a ceramic material, or a high heat dissipating and electrical conducting material. An indentation 41 is then formed in the center on a top side of the second material 40 by CNC machining or stamping. The top side of the second material 40 around the indentation 41 is further coated or deployed by a high thermal conducting insulation paste 42.

At least a light generation chip 50 is fixed in the center of the indentation 41 of the second material 40 by a bonding process. In alternative embodiments, multiple chips 50 of different light colors or of a single light color are employed where, by appropriate control means, various indication or decoration effects from the color combination or illuminating effects of multiple degrees of brightness could be achieved.

A number of metallic leads 60 are arranged in a radial manner around the indentation 41. Each metallic lead 60 has a wiring section 61 on a front end, and high thermal conducting insulation paste 64 are provided on a top side and a bottom side of the wiring section 61. The second material 40, the metallic leads 60, and the first material 30 are stacked in this order from bottom to top and pressed into an integral body so that the wiring sections 61 are sandwiched between the first and second materials 30 and 40. Then, further by stamping, each metallic lead 60 is bended to form a zigzag section 62 and a soldering section 63 so that the soldering sections 63 fan out radially. Then, after wire bonding, a number of gold wires connect the light generation chip 50 and the wiring sections 61, respectively. Finally, the through channel 31 is filled with a packaging material 70. Please note that the through channel 31 is partially filled by the packaging material 70 until the packaging material 70 is flush with the bottom side of the first material 30.

As such, further after the lighting device of the present invention is packaged or welded, the second material 40 would be in direct contact with a heat dissipation material 80 (e.g., an aluminum base board) so that the hear produced by the light generation chip 50 is directly conducted by the second material 40 to the heat dissipation material 80 having a much larger surface area for dissipation. A superior heat dissipation effect is therefore achieved and, as such, the illumination performance would not deteriorate from the high temperature after a long period of usage, and the operational life span is effectively prolonged.

Additionally, as the though channel 31 is not completely filled by the packaging material 70 and the reflective surface of the first material 30 is exposed, light beams emanated from the light generation chip 50 are refracted/reflected first by the packaging material 70 and then by the reflective surface of the through channel 31, thereby achieving brighter and more uniform lighting in the coverage area.

Furthermore, due to the radial arrangements of the metallic leads 60, multiple light generation chips 50 could be powered and controlled, thereby achieving even higher brightness. The exposed metallic leads 60 also avoid the overlapping with the second material 40 and therefore avoid the decrease of heat dissipation area with the heat dissipation material 80. Moreover, the lighting device of the present invention is suitable to various packaging and welding, and could be applied to various illumination and indication applications.

Figure 5:
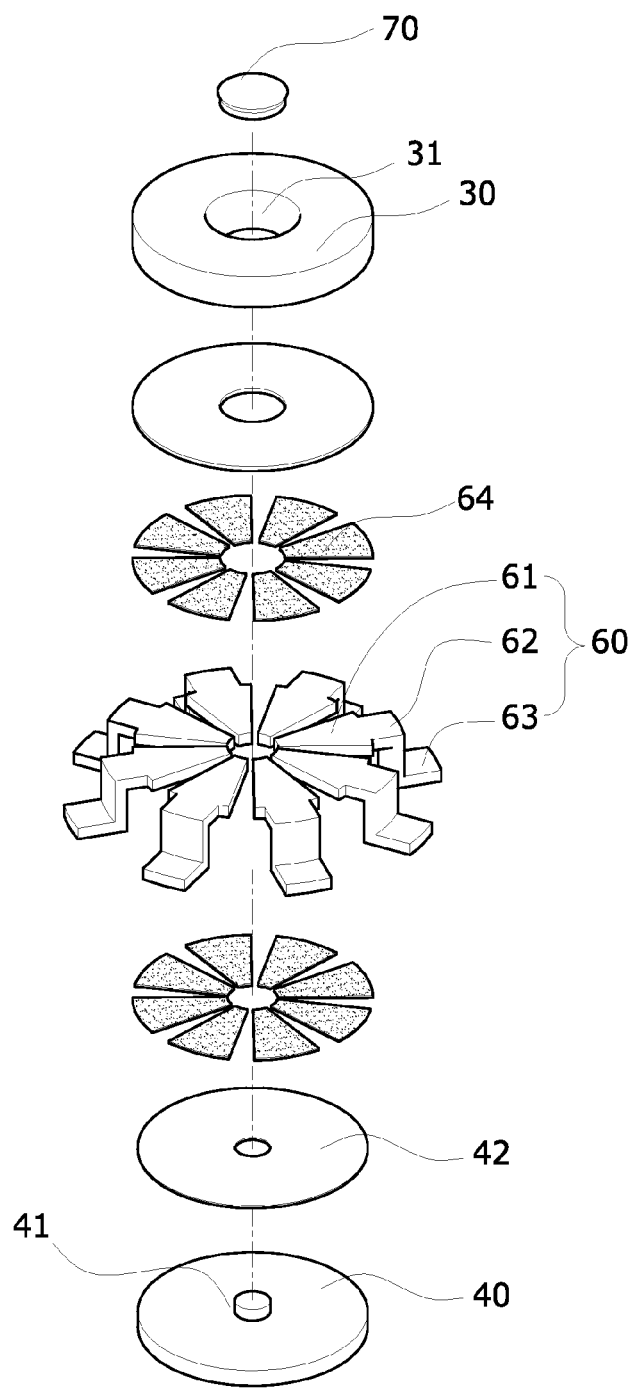
FIG. 5 is a perspective breakdown diagram showing the various components of a lighting device according to another embodiment of the present invention.
Figure 6:
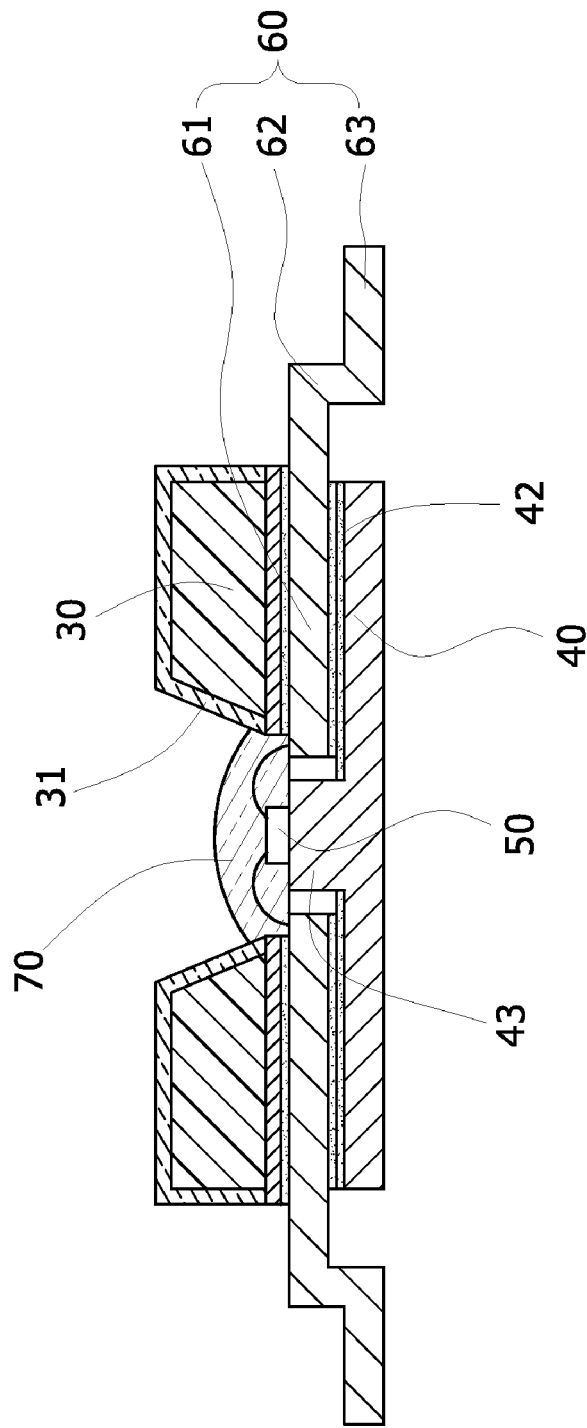
FIG. 6 is a sectional diagram showing the lighting device of FIG. 5.

Please refer to FIGS. 5 and 6, where another embodiment of the present invention of slightly different structure yet with identical effect is illustrated. This embodiment mainly has a raised stand 43 formed in the center on the top side of the second material 40 by chemical etching, stacking, stamping, etc. The high thermal conducting insulation paste 42 is coated on the top side of the second material 40 around the raised stand 43, and the light generation chip 50 is positioned in the center of a top side of the raised stand 43. The top side of the raised stand 43 is flush with the bottom side of the first material 30. The multiple metallic leads 60 are still sandwiched between the first and second materials 30 and 40 and are arranged in a radial manner around the raised stand 43. Each metallic lead 60 is also stamped into having the zigzag section 62 and the soldering section 63 so that the soldering sections 63 fan out radially. Within the obconical through channel 31 of the first material 30, the packaging material 70 is filled to form an upwardly bulging convex lens with the light generation chip 50 entirely embedded inside. The height of the convex lens does not exceed the top side of the first material 30.

Based on the foregoing description and as illustrated in FIGS. 2 to 6, the present invention has the following advantages.

First, the second material 40 is in direct contact with the heat dissipation material 80 so that the heat produced from the light generation chip 50 is directly conducted and dissipated, thereby achieving a superior heat dissipation effect.

Secondly, as the bright surface film 32 is provided on the obconical through channel 31, the light produced by the light generation chip 50 is fully and uniformly refracted/reflected to achieve brighter and more uniform lighting in the coverage area.

Thirdly, as the metallic leads 60 are designed to expose themselves, the lighting device of the present invention is suitable to various packaging and welding, and could be applied to various illumination and indication applications.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention. For example, in some alternative embodiments, the first and second materials are of different shapes and materials, the number of metallic leads is different, etc.

I claim:

1. A lighting device, comprising:
   a first material whose center has an obconical through channel with a larger opening on a top side and a smaller opening on a bottom side of said first material, said bottom side coated with a high thermal conducting insulation paste;
   a second material having an indentation in the center on a top side of said second material, said top side coated with a high thermal conducting insulation paste around said indentation;
   at least a light generation chip positioned inside said indentation of said second material;
   a plurality of metallic leads, each having a wiring section, a zigzag section, and a soldering section;
   wherein a top side and a bottom side of said wiring sections coated with a high thermal conducting insulation paste; said metallic leads arranged in a radial manner around said indentation so that said soldering sections fanning out radially; said second material, said metallic leads, and said first material are stacked in this order from bottom to top and pressed to that said wiring sections sandwiched between said first and second materials; said first material, said second material, and said metallic leads are electrical insulated; said light generation chips are electrically connected to said wiring sections, respectively; and said through channel is partially filled with a packaging material.

2. The lighting device according to claim 1, wherein said light generation chips are of different light colors.

3. The lighting device according to claim 1, wherein said light generation chips are of a single light color.

4. The lighting device according to claim 1, wherein said first material is a plastic material and an external surface of said first material is coated with a bright surface film.

5. The lighting device according to claim 1, wherein said first material is a PCB material and an external surface of said first material is coated with a bright surface film.

6. The lighting device according to claim 1, wherein said first material is a metallic material and an external surface of said first material is coated with a bright surface film.

7. The lighting device according to claim 1, wherein said second material is a metallic material.

8. The lighting device according to claim 1, wherein said second material is a graphite material.

9. The lighting device according to claim 1, wherein said packaging material is filled so that a top side of said packaging material is flush with said bottom side of said first material.

* * * * *